United States Patent
Yeh et al.

(10) Patent No.: US 11,935,947 B2
(45) Date of Patent: Mar. 19, 2024

(54) ENHANCEMENT MODE HIGH ELECTRON MOBILITY TRANSISTOR

(71) Applicant: UNITED MICROELECTRONICS CORP., Hsin-Chu (TW)

(72) Inventors: Chih-Tung Yeh, Taoyuan (TW); Chun-Ming Chang, Kaohsiung (TW); Bo-Rong Chen, Hsinchu County (TW); Shin-Chuan Huang, Tainan (TW); Wen-Jung Liao, Hsinchu (TW); Chun-Liang Hou, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 280 days.

(21) Appl. No.: 16/596,738

(22) Filed: Oct. 8, 2019

(65) Prior Publication Data
US 2021/0066484 A1 Mar. 4, 2021

(30) Foreign Application Priority Data
Sep. 4, 2019 (TW) .................. 108131821

(51) Int. Cl.
*H01L 29/778* (2006.01)
*H01L 29/20* (2006.01)
*H01L 29/205* (2006.01)
*H01L 29/49* (2006.01)

(52) U.S. Cl.
CPC ...... *H01L 29/7786* (2013.01); *H01L 29/2003* (2013.01); *H01L 29/205* (2013.01); *H01L 29/4916* (2013.01); *H01L 29/495* (2013.01); *H01L 29/7787* (2013.01)

(58) Field of Classification Search
None
See application file for complete search history.

(56) References Cited

U.S. PATENT DOCUMENTS

| 7,728,356 | B2 | 6/2010 | Suh |
| 7,851,825 | B2 | 12/2010 | Suh |
| 8,604,486 | B2 | 12/2013 | He |

(Continued)

FOREIGN PATENT DOCUMENTS

| TW | I569439 B | 2/2017 |
| TW | 201733118 A | 9/2017 |

OTHER PUBLICATIONS

Lu, Y. "Characterization of SiNx/AlN passivation stack with epitaxial AlN grown on AlGaN/GaN heterojunctions by plasma-enhanced atomic layer deposition" App. Phys. Exp. 8 from Jpn. Soc. Of Appl. Phys. May 18, 2015 pp. 064101-1 through 064101-4 (Year: 2015).*

(Continued)

*Primary Examiner* — Grant S Withers
(74) *Attorney, Agent, or Firm* — Winston Hsu (57) ABSTRACT

An enhancement mode high electron mobility transistor (HEMT) includes a group III-V semiconductor body, a group III-V barrier layer and a gate structure. The group III-V barrier layer is disposed on the group III-V semiconductor body, and the gate structure is a stacked structure disposed on the group III-V barrier layer. The gate structure includes a gate dielectric and a group III-V gate layer disposed on the gate dielectric, and the thickness of the gate dielectric is between 15 nm to 25 nm.

15 Claims, 6 Drawing Sheets

(56) References Cited

U.S. PATENT DOCUMENTS

| | | | |
|---|---|---|---|
| 9,847,401 B2 | 12/2017 | Chiu | |
| 10,269,947 B1* | 4/2019 | Moens | H01L 29/7786 |
| 2014/0239306 A1* | 8/2014 | Liu | H01L 29/201 |
| | | | 438/197 |
| 2017/0250272 A1* | 8/2017 | Tipirneni | H01L 29/66462 |

OTHER PUBLICATIONS

Lin, Y-K "A versatile low-resistance ohmic contact process with ohmic recess and low-temperature annealing for GaN HEMTs" Semicond. Sci. Technol. 33 Aug. 21, 2018 pp. 1-8 (Year: 2018).*

Pu, T. "Normally-off AlGaN/GaN heterostructure junction field-effect transistors with blocking layers" Super. And Micro. 120, May 31, 2018 pp. 448-453 (Year: 2018).*

Li, Y " AlGaN/GaN high electron mobility transistors on Si with sputtered TiN gate" Phys. Status. Solidi A 214, No. 3 Nov. 7, 2016 pp. 1600555 1-7 (Year: 2016).*

Mizue, Chihoko "Capacitance-Voltage Characteristics of Al2O3/AlGaN/GaN Structures and State Density Distribution at Al2O3/AlGaN Interface"Jap. Jour. Of App. Phys. 50 Feb. 21, 2011 pp. 021001-1 through 7 (Year: 2011).*

English translation of TW I569439 published Feb. 1, 2017 (Year: 2017).*

Chiu, "High Uniformity Normally-OFF p-GaN Gate HEMT Using Self-Terminated Digital Etching Technique", IEEE Transactions On Electron Devices, vol. 65, No. 11, Nov. 2018, Oct. 1, 2018.

Marcon, "Direct comparison of GaN-based e-mode architectures (recessed MISHEMT and p-GaN HEMTs) processed on 200mm GaN-on-Si with Au-free technology", Proceedings of SPIE vol. 9363 936311, Mar. 13, 2015.

* cited by examiner

ENHANCEMENT MODE HIGH ELECTRON MOBILITY TRANSISTOR

BACKGROUND OF THE INVENTION

1. Field of the Invention

The present disclosure relates generally to the field of high electron mobility transistors, and more particularly to an enhancement mode high electron mobility transistor.

2. Description of the Prior Art

In semiconductor technology, group III-V semiconductor compounds may be used to form various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a heterojunction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies. However, the drawbacks in the conventional HEMTs, such as relatively large gate leakage and relatively low breakdown voltage, still need to be overcome.

SUMMARY OF THE INVENTION

In view of the above, it is necessary to provide an improved high electron mobility transistor in order to improve the drawbacks of the conventional high electron mobility transistors.

According to one embodiment of the present disclosure, an enhancement mode high electron mobility transistor being disclosed includes a group III-V body, a group III-V barrier layer, and a gate structure. The group III-V barrier layer is disposed on the group III-V body, and the gate structure is a stacked structure disposed on the group III-V barrier layer. The gate structure includes a gate dielectric layer and a group III-V gate layer disposed over the gate dielectric layer, and the gate dielectric layer has a thickness between 15 nm and 25 nm.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about"

means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

The present disclosure is directed to a group III-V high electron mobility transistor (HEMT) and method for manufacturing the same. III-V HEMTs on silicon substrates are used as power switching transistors for voltage converter applications. Compared to silicon power transistors, III-V HEMTs feature low on-state resistances and low switching losses due to wide bandgap properties. In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Further, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN) and the like. In a similar manner, a "III-nitride semiconductor" refers to a compound semiconductor that includes nitrogen and at least one group III element, such as, but not limited to, GaN, aluminum nitride (AlN), indium nitride (InN), AlGaN, InGaN, InAlGaN and the like.

Figure 1:
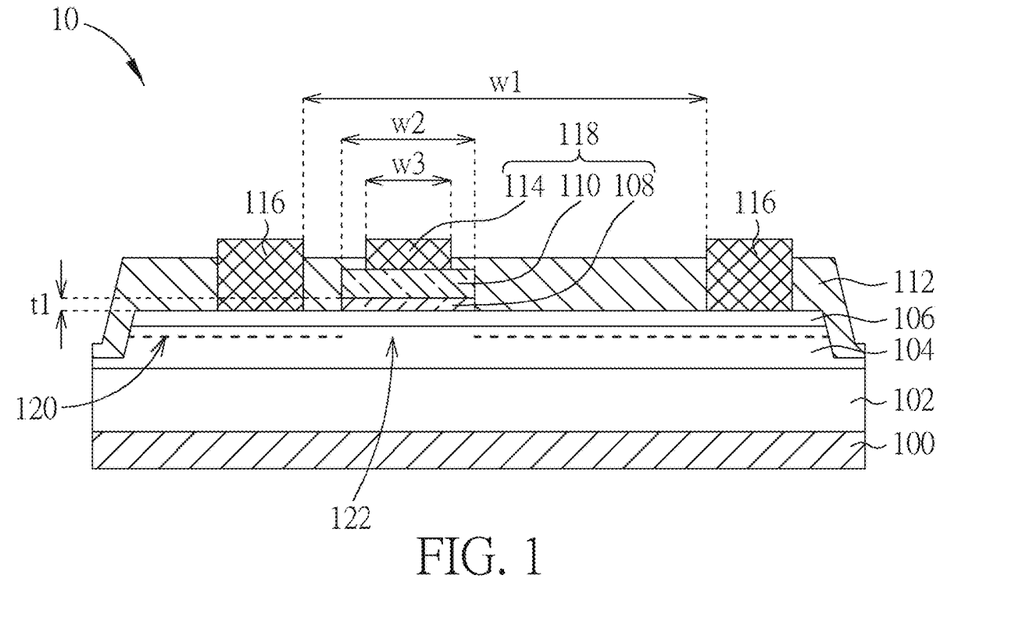
FIG. 1 is a schematic cross-sectional view of a high electron mobility transistor (HEMT) in accordance with one embodiment of the present disclosure.

FIG. 1 is a schematic cross-sectional view of a high electron mobility transistor (HEMT) in accordance with one embodiment of the present disclosure. Referring to FIG. 1, a high electron mobility transistor 10, such as an enhancement mode high electron mobility transistor, is disposed on a substrate 100. A group III-V body 104, a group III-V barrier layer 106, and a gate structure 118 may be disposed on the substrate 100 in sequence, where the group III-V barrier layer 106 is disposed on the group III-V body 104. The gate structure 118 is a stacked structure including a gate dielectric layer 108 and a group III-V gate layer 110 being disposed on the gate dielectric layer 108. The gate structure 118 may further include a group III-V gate electrode 114 disposed on the group III-V gate layer 110. The gate dielectric layer 108 may be a crystalline high-k dielectric layer having a thickness t1 between 15 nm and 25 nm, such as 15 nm, 20 nm or 25 nm. The high electron mobility transistor 10 can also include at least two source/drain electrodes 116 disposed on opposite sides of the gate structure 118, respectively. For the high electron mobility transistor 10 disclosed in the above embodiment, the carrier mobility in a 2-DEG cutoff region 122 under the gate structure 118 may be well controlled by appropriately biasing the gate structure 118 so as to turn on or turn off the high electron mobility transistor 10. In addition, the high electron mobility transistor 10 may also have lower gate leakage and a higher breakdown voltage by disposing the gate dielectric layer 108 and the group III-V gate layer 110.

The group III-V group body 104 may include one or more layers of group III-V semiconductor composed of GaN, AlGaN, InGaN, or InAlGaN, but is not limited thereto. In addition, the group III-V body 104 may also be one or more layers of doped group III-V semiconductor, such as p-type III-V semiconductor. For the p-type group III-V semiconductor, the dopants of which may be C, Fe, Mg or Zn, but is not limited thereto. The group III-V barrier layer 106 may include one or more layers of group III-V semiconductor with the composition different from that of the group III-V semiconductor of the group III-V body 104. For example, the group III-V barrier layer 106 may comprise AlN, $Al_yGa_{(1-y)}N$ (0<y<1), or a combination thereof. In accordance with one embodiment, the group III-V body 104 may be an undoped GaN layer, and the group III-V barrier layer 106 may be an inherent n-type AlGaN layer. Since there is a discontinuous energy gap between the group III-V body 104 and the group III-V barrier layer 106, by stacking the group III-V body 104 and the group III-V barrier layer 106 on each other (and vice versa), a thin layer with high electron mobility, also called a two-dimensional electron gas region 120, may be generated due to the piezoelectric effect between the group III-V body 104 and the group III-V barrier layer 106.

The gate dielectric layer 108 is disposed on the top surface of the group III-V barrier layer 106, which may be a crystalline dielectric layer with high dielectric constant (high-k), such as a high-k single crystalline or polycrystalline dielectric. The composition of the gate dielectric layer 108 may include metal oxide or metal nitride, such as $Al_2O_3$, AlN or other high-k crystalline dielectric. In addition, the group III-V gate layer 110 disposed on the gate dielectric layer 108 may include one or more layers of group III-V semiconductor, and the composition of the group III-V semiconductor may be GaN, AlGaN, InGaN, or InAlGaN, but is not limited thereto. In addition, the group III-V gate layer 110 may also be one or more layers of doped group III-V semiconductor, such as p-type III-V semiconductor. For the p-type group III-V semiconductor layer, the dopants of which may be C, Fe, Mg or Zn, but is not limited thereto. In accordance with one embodiment, the group III-V gate layer 110 may be a p-type GaN layer. In addition, the gate electrode 114 and the source/drain electrodes 116 may be electrically conductive electrodes. There is a first width w1 between the inner sides of adjacent two source/drain electrodes 116 so that the gate structure 118 may be disposed in the region defined by the first width w1. The gate dielectric layer 108 and the group III-V gate layer 110 may have the same width, such as a second width w2, such that the gate dielectric layer 108 and the group III-V gate layer 110 may be substantially coextensive. The second width w2 is smaller than the first width w1. The gate electrode 114 may have a third width w3 smaller than the second width w2 such that portions of the top surface of the III-V gate layer 110 may be exposed from the gate electrode 114 (i.e. not covered by the gate electrode 114).

In addition, a buffer layer 102 may be further disposed between the substrate 100 and the group III-V body 104. The purpose of the buffer layer 102 may be to reduce stress or lattice mismatch between the substrate 100 and the group III-V body 104. In addition, an additional passivation layer 112 may be further disposed to completely cover the group III-V body 104 and the group III-V barrier layer 106 so as to eliminate or reduce the surface defects on the sidewalls of the group III-V body 104 and those on the top surface of the group III-V barrier layer 106. Thus, the electron mobility of the two-dimensional electron gas region 120 may be further enhanced.

In order to enable one of ordinary skill in the art to implement the present disclosure, a method of fabricating the high electron mobility transistor of the present disclosure is further described below.

Figure 2:
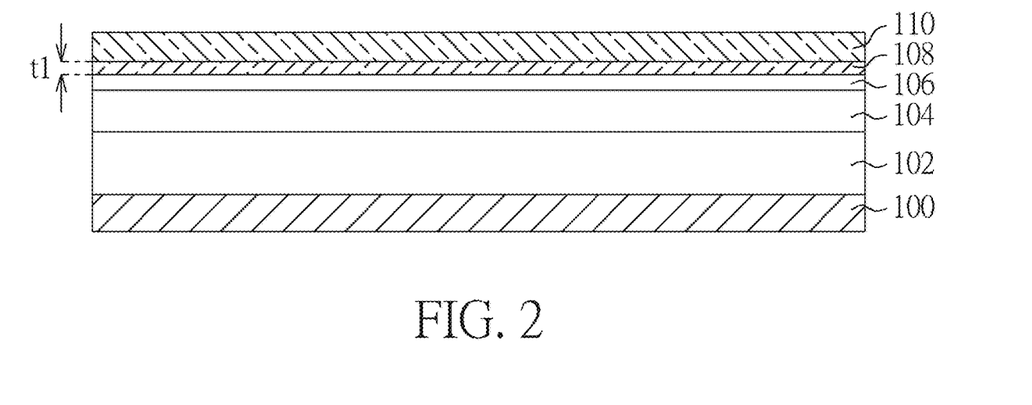
FIG. 2 is a cross-sectional view of a HEMT where a body, a barrier layer, a gate dielectric layer, and a gate electrode layer are disposed on a substrate in accordance with one embodiment of the present disclosure.

FIG. 2 is a schematic cross-sectional view of a HEMT where a body, a barrier layer, a gate dielectric layer, and a gate electrode layer are disposed on a substrate in accordance with one embodiment of the present disclosure. Referring to FIG. 2, the buffer layer 102, the group III-V body 104, the group III-V barrier layer 106, the gate dielectric layer 108, and the group III-V gate layer may be stacked on the substrate 100 in sequence. The substrate 100 may be a bulk silicon substrate, a silicon carbide (SiC) substrate, a sapphire substrate, a silicon on insulator (SOI) substrate or a germanium on insulator (GOI) substrate, but is not limited thereto. The stacked layers on the substrate 100 may be formed through any suitable growth processes, such as molecular-beam epitaxy (MBE), metal-organic chemical vapor deposition (MOCVD), hydride vapor phase epitaxy (HVPE), atomic layer deposition (ALD) or other suitable growth processes. The buffer layer 102 may include a plurality of sub-semiconductor layers (i.e., multiple layers) and the overall resistance of the buffer layer 102 may be higher than the resistance of other layers on the substrate 100. Specifically, for a case where the substrate 100 and the group III-V body 104 are a silicon substrate and a GaN layer, respectively, the buffer layer 102 may be graded aluminum gallium nitride ($Al_xGa_{(1-x)}N$) where there is a continuous or stepwise decrease in the x ratio from 0.9 to 0.15 along the direction from the substrate to the group III-V body 104.

Figure 3:
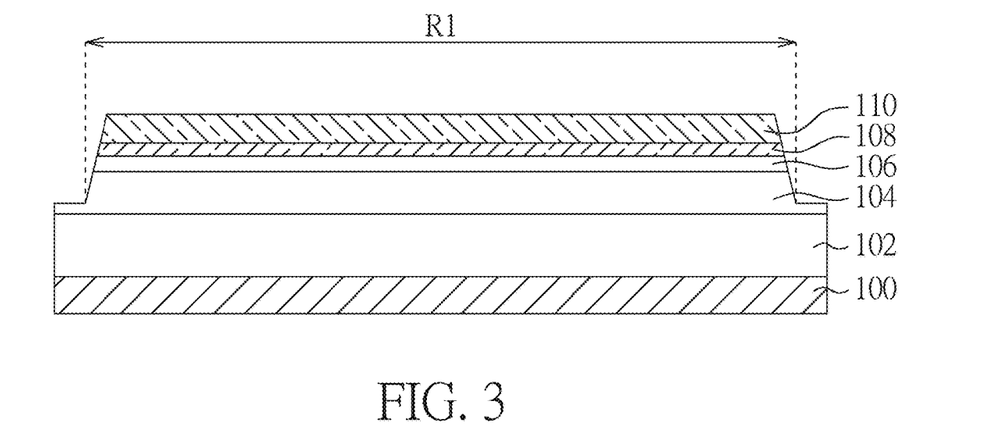
FIG. 3 is a schematic cross-sectional view of a HEMT where an active region is defined on a substrate in accordance with one embodiment of the present disclosure.

FIG. 3 is a schematic cross-sectional view of a HEMT where an active region is defined on a substrate in accordance with one embodiment of the present disclosure. Referring to FIG. 3, one or more photolithographic and etching processes may be conducted to sequentially etch away portions of the group III-V gate layer 110, the gate dielectric layer 108, the group III-V barrier layer 106, and the group III-V body 104 so as to form a mesa region R1 on the substrate 100. The mesa region R1 is a protruding structure. In the subsequent processes, the periphery of the mesa region R1 may be surrounded by an insulating structure which is used to avoid unnecessary electrical connection between the mesa region R1 and other semiconductor components in the periphery.

Figure 4:
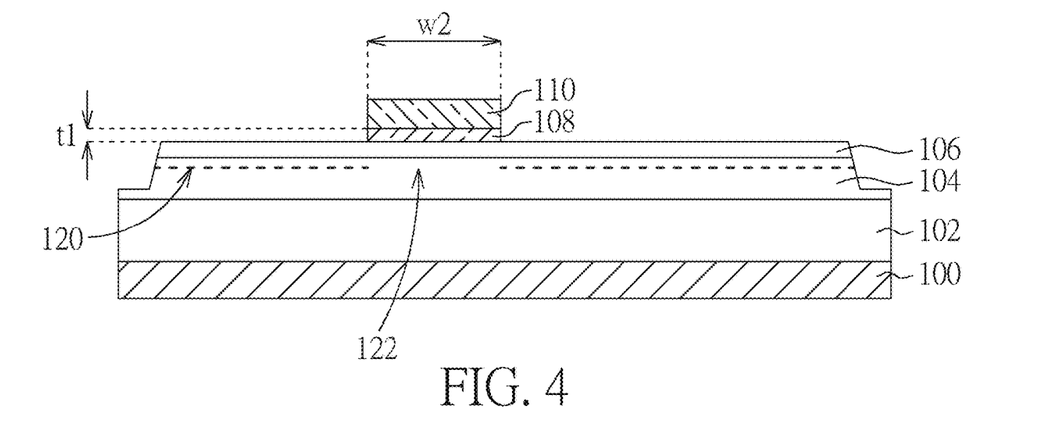
FIG. 4 is a cross-sectional view of a HEMT after a gate electrode layer and a gate dielectric layer are patterned in accordance with one embodiment of the present disclosure.

FIG. 4 is a cross-sectional view of a HEMT after a gate electrode layer and a gate dielectric layer are patterned in accordance with one embodiment of the present disclosure. Referring to FIG. 3, the gate electrode layer 110 and the gate dielectric layer 108 on the substrate 100 may be simultaneously or separately patterned to expose a portion of the top surface of the group III-V barrier layer 106. The patterned gate dielectric layer 108 and the patterned group III-V gate layer 110 may have the same width (such as a second width w2) such that the patterned gate dielectric layer 108 and the patterned group III-V gate layer 110 may be substantially coextensive. In addition, for the region not covered by the patterned group III-V gate layer 110, the two-dimensional electron gas may be generated in the two-dimensional electron gas region 120 due to the piezoelectric effect between the group III-V body 104 and the group III-V barrier layer 106. In contrast, for the region covered by the group III-V gate layer 110, the region may be regarded as a 2-DEG cutoff region 122 since there is no two-dimensional electron gas generated in this region.

Figure 5:
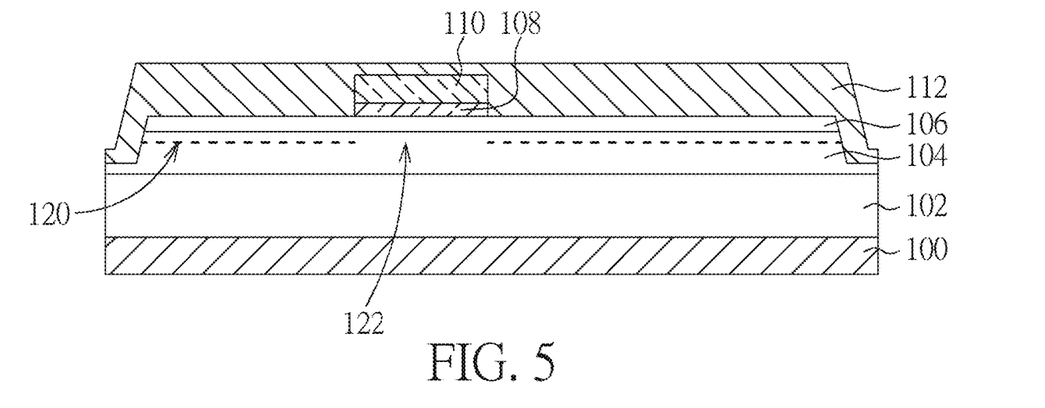
FIG. 5 is a schematic cross-sectional view of a HEMT where a patterned gate electrode layer and a patterned gate dielectric layer are covered by a passivation layer in accordance with one embodiment of the present disclosure.

FIG. 5 is a cross-sectional view of a HEMT where a patterned gate electrode layer and a patterned gate dielectric layer are covered by a passivation layer in accordance with one embodiment of the present disclosure. Referring to FIG. 5, the passivation layer 112 can be formed through a suitable deposition process. The passivation layer 112 composed of SiN, AlN, $Al_2O_3$ or $SiO_2$, but is not limited thereto, may completely cover the group III-V gate layer 110, the group III-V body 104, and the group III-V barrier layer 106 so as to eliminate or reduce the surface defects on the sidewalls of the group III-V body 104 and those on the top surface of the group III-V barrier layer 106. Thus, the electron mobility of the two-dimensional electron gas region 120 may be further enhanced.

Figure 6:
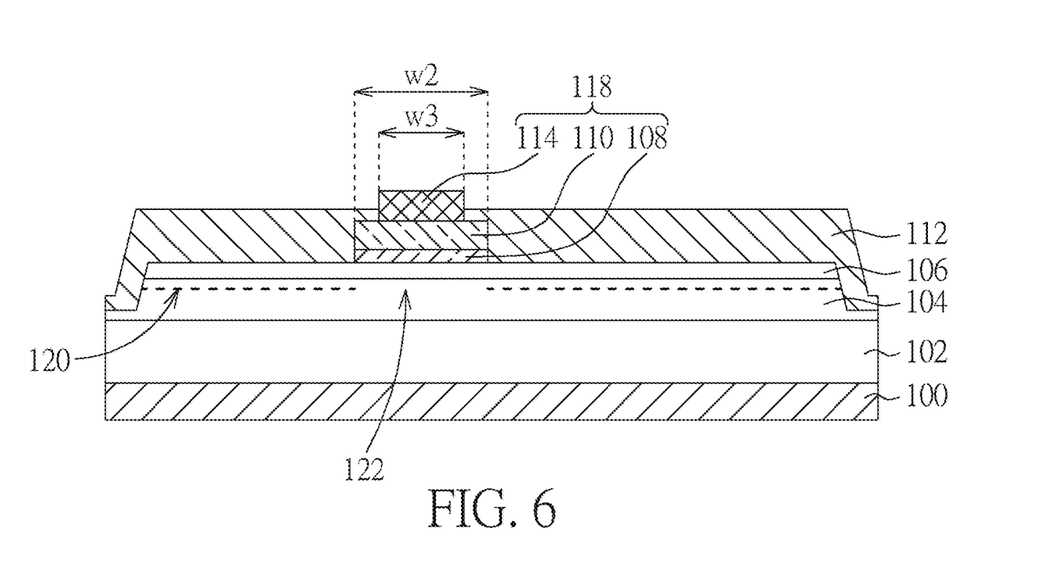
FIG. 6 is a cross-sectional view of a HEMT after a gate electrode layer is formed on a gate electrode layer in accordance with one embodiment of the present disclosure.

FIG. 6 is a cross-sectional view of a HEMT when a gate electrode layer is formed on a gate electrode layer in accordance with one embodiment of the present disclosure. Referring to FIG. 6, a contact hole (not shown) may be formed in the passivation layer 112 directly above the group III-V gate layer 110 by photolithographic and etching processes. A suitable deposition and etching processes may be then performed to form a gate electrode 114 filling up the contact hole. The gate electrode 114 is a conductive electrode composed of titanium, aluminum or doped polysilicon, but is not limited thereto. The gate electrode 114 is disposed on the top surface of the group III-V gate layer 110, thereby forming a Schottky barrier with the group III-V gate layer 110. The width of the gate electrode 114 (i.e., a third width w3) may be smaller than the width of the group III-V gate layer 110 (i.e., the second width w2).

Figure 7:
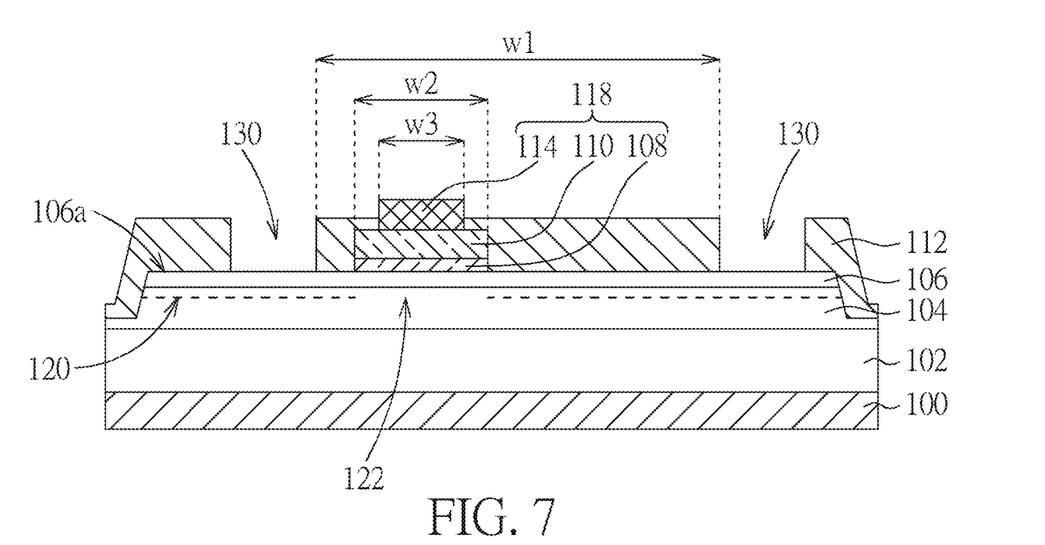
FIG. 7 is a schematic cross-sectional view of a HEMT after contact holes are formed in a passivation layer in accordance with one embodiment of the present disclosure.

FIG. 7 is a schematic cross-sectional view of a HEMT after contact holes are formed in a passivation layer in accordance with one embodiment of the present disclosure. Referring to FIG. 7, at least two contact holes 130 may be formed in the passivation layer 112 directly above the group III-V barrier layer 106 by photolithographic and etching processes, and the contact holes 130 are respectively located on both sides of the group III-V gate layer 110. Portions of the top surface of the group III-V barrier layer 106 are exposed from the bottoms of the contact holes 130. In addition, in the case where the top surface of the group III-V barrier layer 106 is provided with an etch stop layer (e.g., AlN), the passivation layer 112 may be first etched, and then the etch stop layer may be etched away during the process of forming the contact holes 130 so as to expose portions of the top surface of the group III-V barrier layer 106.

Then, source/drain electrodes 116 filling up the contact holes 130 may be formed through suitable deposition and etching processes so as to obtain the structure shown in FIG. 1. According to the above embodiment, the gate electrode 114 and the source/drain electrodes 116 are formed in sequence. However, according to some embodiments, the gate electrode 114 and the source/drain electrodes 116 may be formed concurrently. For example, contact holes for accommodating the gate electrode 114 and the source/drain electrodes 116 may be formed concurrently, and then the same deposition and etching processes are carried out to form the gate electrode 114 and the source/drain electrodes in respective contact holes 116.

Figure 8:
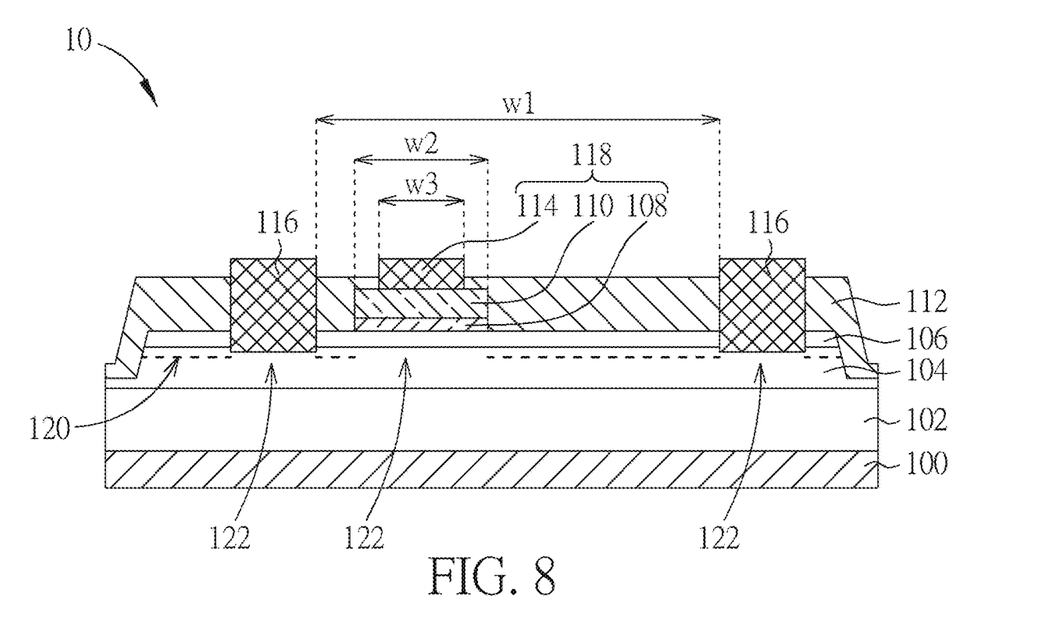
FIG. 8 is a schematic cross-sectional view of a HEMT after source/drain electrodes are formed in contact holes in accordance with one embodiment of the present disclosure.

In addition to the embodiments described above, the present disclosure may further include embodiments of other high electron mobility transistors. FIG. 8 is a schematic cross-sectional view of a HEMT after source/drain electrodes are formed in contact holes in accordance with one embodiment of the present disclosure. Referring to FIG. 8, the structure of the high electron mobility transistor 10 is substantially similar to that shown in FIG. 1. The main difference between the two embodiments is that the bottom of the source/drain electrodes 116 may penetrate the group III-V barrier layer 106 thus further extends into the group III-V body 104. Moreover, according to another embodiment, the bottom of the source/drain electrodes 116 may not penetrate the group III-V barrier layer 106 such that their bottoms are located in the group III-V barrier layer 106. Since the source/drain electrodes 116 are disposed in the group III-V body 104 or the group III-V barrier layer 106, the contact resistance between the source/drain electrodes 116 and the group III-V body 104 or the group III-V barrier layer 106 may be further reduced. In addition, there is also a 2-DEG cutoff region 122 correspondingly formed under the source/drain electrodes 116.

Figure 9:
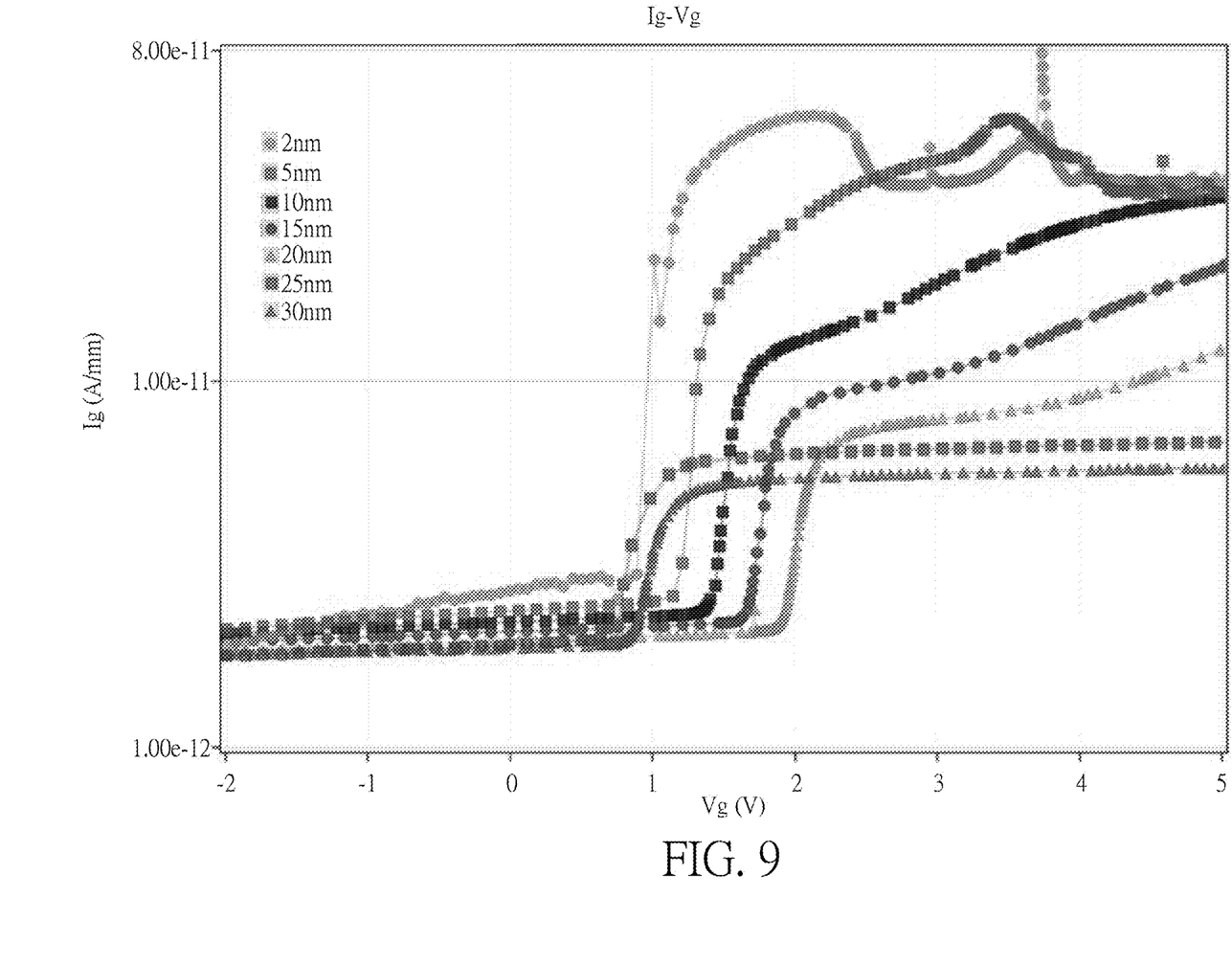
FIG. 9 shows simulation result of the electrical performance of HEMT in accordance with one embodiment of the present disclosure.

FIG. 9 is a simulation result showing electrical characteristics of HEMT according to one embodiment of the present disclosure. For HEMTs with different gate dielectric thicknesses, HEMTs may show different Ig-Vg curves, or gate-leakage current curves, when a fixed source/drain voltage bias is applied. Referring to FIG. 9, for a HEMT having a gate dielectric layer at a thickness of less than 20 nm (e.g., HEMTs having a gate dielectric layer at a thickness of 2 nm, 5 nm or 10 nm, respectively), the Ig rises abruptly when Vg between 1 V and 2 V is applied to the HEMTs, which means that the corresponding HEMTs may generate large gate-leakage current. In addition, for a HEMT having a gate dielectric layer at a thickness of greater than 25 nm (e.g., HEMTs having a gate dielectric layer at a thickness of 30 nm), the corresponding Ig rises sharply when the Vg is only about 1 V to 1.5 V, which means the HEMT has lower threshold voltage for generating leakage current. In contrast, for HEMTs having a gate dielectric layer at a thickness in a certain range (e.g., HEMTs having a gate dielectric layer at a thickness of 15 nm or 20 nm, respectively), its Ig may still be smaller than the Ig of the HEMTs having the dielectric layers at the thicknesses of 2 nm, 5 nm or 10 nm, respectively, when Vg being applied is greater than 3V. Besides, its Ig does not rise abruptly when the Vg between 1 V to 1.5 V is applied, which means that the HEMT has a higher threshold voltage for generating leakage current. In other words, the HEMT may show better electrical performance when the thickness of its gate dielectric layer is in a certain range (e.g., HEMTs having a gate dielectric layer at a thickness of 15 nm or 20 nm, respectively).

Figure 10:
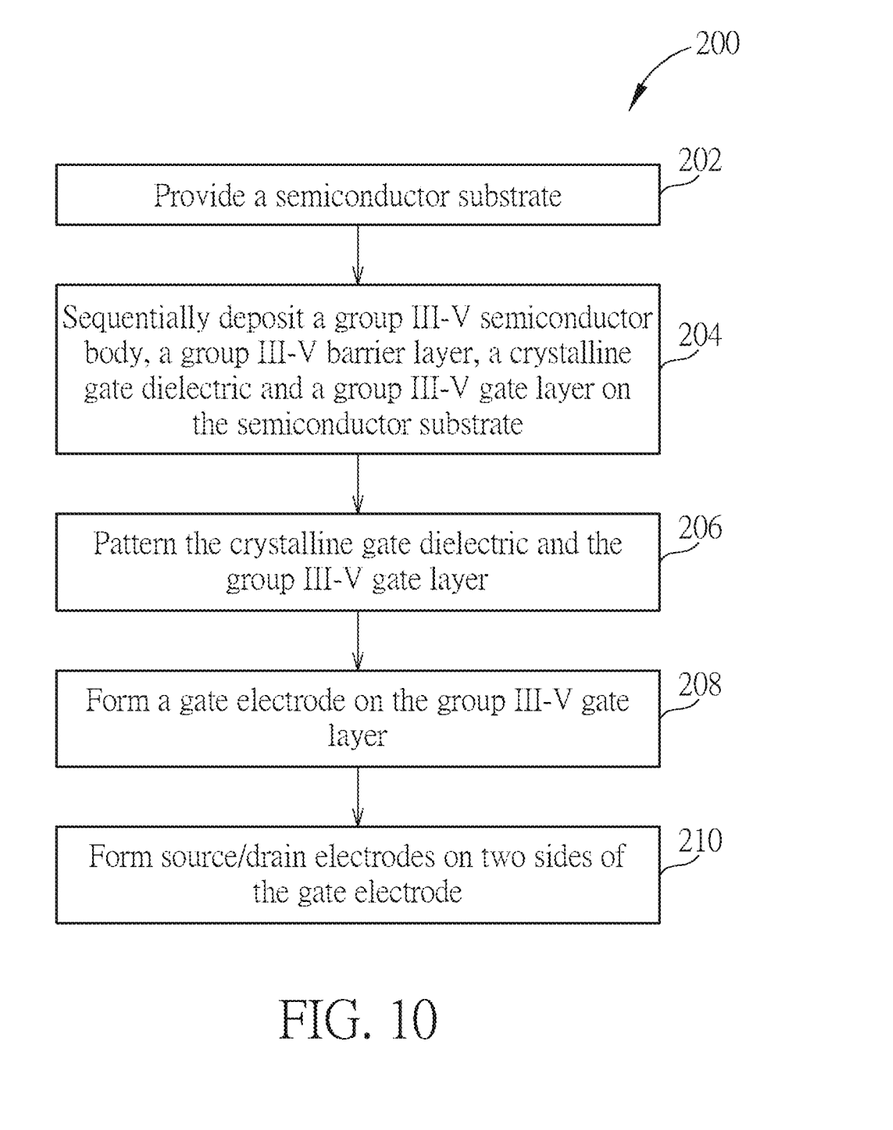
FIG. 10 is a flow chart illustrating a method for fabricating a HEMT in accordance with one embodiment of the present disclosure.

FIG. 10 is a flow chart illustrating a method for fabricating an HEMT in accordance with one embodiment of the present disclosure. Referring to FIG. 9, according to one embodiment of the present disclosure, a method 200 of fabricating a high electron mobility transistor may include the following steps. Step 202: provide a semiconductor substrate; step 204: sequentially deposit a group III-V body, a group III-V barrier layer, a crystalline gate dielectric layer, and a group III-V gate layer on the semiconductor substrate; step 206: pattern the crystalline gate dielectric layer and the group III-V gate layer; step 208: form a gate electrode on the group III-V gate layer; and step 210: form source/drain electrodes on two sides of the gate electrode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An enhancement mode high electron mobility transistor, comprising:
   a group III-V body;
   a group III-V barrier layer, disposed on the group III-V body;
   a gate structure, disposed on the group III-V barrier layer, wherein the gate structure is a stacked structure comprising a gate dielectric layer and a group III-V gate layer being disposed above the gate dielectric layer, the gate dielectric layer is disposed between the group III-V barrier layer and the group III-V gate layer, a bottom surface of the gate dielectric layer is in direct contact with the group III-V barrier layer, and a top surface of the gate dielectric layer is in direct contact with a bottom surface of the group III-V gate layer;
   a passivation layer, covering and in contact with a top surface of the group III-V barrier layer, a sidewall of the group III-V barrier layer and a sidewall of the group III-V body, wherein a bottom surface of the passivation layer is located in the group III-V body; and
   at least two source/drain electrodes, disposed on the group III-V barrier layer,
   wherein the composition of the gate dielectric layer comprises single crystal aluminum nitride, a total thickness of the gate dielectric layer is greater than 15 nm and less than 25 nm, and the gate dielectric layer is laterally separated from the at least two source/drain electrodes.

2. The enhancement mode high electron mobility transistor of claim 1, wherein the group III-V semiconductor body has a band gap discontinuity with the group III-V barrier layer.

3. The enhancement mode high electron mobility transistor of claim 1, wherein the group III-V gate layer is a p-type III-V gate layer.

4. The enhancement mode high electron mobility transistor of claim 1, wherein each of the source/drain electrodes is partially disposed in the group III-V barrier layer.

5. The enhancement mode high electron mobility transistor of claim 4, wherein the group III-V barrier layer has a first width defined between inner sides of the source/drain electrodes, and the group III-V gate layer has a second width, and the first width is greater than the second width.

6. The enhancement mode high electron mobility transistor of claim 1, further comprising a gate electrode disposed on the group III-V gate layer.

7. The enhancement mode high electron mobility transistor of claim 6, wherein the composition of the gate electrode comprises titanium, aluminum or doped polysilicon.

8. The enhancement mode high electron mobility transistor of claim 6, wherein the group III-V gate layer has a second width and the gate electrode has a third width, and the second width is greater than the third width.

9. The enhancement mode high electron mobility transistor of claim 1, wherein the group III-V gate layer and the gate dielectric layer have a same width.

10. The enhancement mode high electron mobility transistor of claim 1, wherein the composition of the group III-V body comprises gallium nitride.

11. The enhancement mode high electron mobility transistor of claim 1, wherein the composition of the group III-V barrier layer comprises aluminum gallium nitride.

12. The enhancement mode high electron mobility transistor of claim 1, wherein the group III-V body is disposed on a substrate.

13. The enhancement mode high electron mobility transistor of claim 12, wherein the composition of the substrate comprises silicon, silicon carbide or sapphire.

14. The enhancement mode high electron mobility transistor of claim 12, further comprising a buffer layer disposed between the substrate and the group III-V body.

15. The enhancement mode high electron mobility transistor of claim 14, wherein the buffer layer is a group III-V buffer layer, and a concentration of at least one metal element of the group III-V buffer layer gradually decreases from the substrate to the group III-V body.

* * * * *